(12) United States Patent
Hansen

(10) Patent No.: US 11,387,054 B2
(45) Date of Patent: Jul. 12, 2022

(54) ELECTRICAL CIRCUIT INCLUDING A SUPERCAPACITOR WITH REDUCED LEAKAGE

(71) Applicant: AVX Corporation, Fountain Inn, SC (US)

(72) Inventor: Shawn Hansen, Simpsonville, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 50 days.

(21) Appl. No.: 16/275,566

(22) Filed: Feb. 14, 2019

(65) Prior Publication Data

US 2019/0259550 A1 Aug. 22, 2019

Related U.S. Application Data

(60) Provisional application No. 62/633,811, filed on Feb. 22, 2018.

(51) Int. Cl.
| | | |
|---|---|---|
| *H01G 11/80* | (2013.01) | |
| *H01G 11/26* | (2013.01) | |
| *H01G 11/74* | (2013.01) | |
| *H05K 1/18* | (2006.01) | |
| *G01R 11/02* | (2006.01) | |
| *G01F 15/00* | (2006.01) | |

(52) U.S. Cl.
CPC .............. *H01G 11/80* (2013.01); *H01G 11/26* (2013.01); *H01G 11/74* (2013.01); *H05K 1/181* (2013.01); *G01F 15/00* (2013.01); *G01R 11/02* (2013.01); *H05K 2201/10015* (2013.01); *H05K 2201/10151* (2013.01)

(58) Field of Classification Search
CPC ........ H01G 9/145; H01G 11/78; H01G 11/80; H01G 11/26; H01G 11/74; G01F 15/00; H05K 1/181; H05K 2201/10015; H05K 2201/10151
USPC .......................... 361/502, 503, 511; 176/536
See application file for complete search history.

(56) References Cited

U.S. PATENT DOCUMENTS

| 4,763,227 A | 8/1988 | Novacek |
| 5,093,762 A | 3/1992 | Sato |
| 6,169,325 B1 | 1/2001 | Azuma et al. |
| (Continued) | | |

FOREIGN PATENT DOCUMENTS

| CN | 204230059 U | 3/2015 |
| JP | H 01230218 A | 9/1989 |
| (Continued) | | |

OTHER PUBLICATIONS

Information from VINATech—Sealed Supercapacitors are Suitable for Intrinsically Safe Applications, Aug. 16, 2015, 2 pages.
(Continued)

*Primary Examiner* — Arun Ramaswamy
(74) *Attorney, Agent, or Firm* — Dority & Manning, P.A.

(57) ABSTRACT

An electrical circuit is provided including a substrate having a generally planar surface. A supercapacitor assembly includes a container having a length in a longitudinal direction. The supercapacitor assembly includes an electrode assembly enclosed within the container, and the electrode assembly may have a jelly-roll configuration. An angle ranging from about 0 to about 30 degrees is formed between the longitudinal direction of the container and the generally planar surface of the substrate.

17 Claims, 7 Drawing Sheets

(56) References Cited

U.S. PATENT DOCUMENTS

| | | | |
|---|---|---|---|
| 6,413,283 B1 | 7/2002 | Day et al. | |
| 7,342,768 B2 | 3/2008 | Doljack et al. | |
| 7,483,259 B2 | 1/2009 | Biler | |
| 7,580,245 B2 | 8/2009 | Inoue et al. | |
| 7,813,105 B2 | 10/2010 | Cheung | |
| 7,859,844 B2 | 12/2010 | Nguyen et al. | |
| 8,116,044 B2 | 2/2012 | Pelc et al. | |
| 8,194,393 B2 | 6/2012 | Inoue et al. | |
| 8,358,109 B2 | 1/2013 | Gunderson | |
| 8,723,506 B2 | 5/2014 | Ramirez | |
| 8,829,350 B2 | 9/2014 | Iwasaki et al. | |
| 8,932,750 B2 | 1/2015 | Cooley | |
| 9,728,342 B2 | 8/2017 | Bendale et al. | |
| 10,312,028 B2 | 6/2019 | Rawal et al. | |
| 2006/0146480 A1* | 7/2006 | Thrap | H01G 11/82 361/522 |
| 2009/0034160 A1* | 2/2009 | Takeda | H01G 9/035 361/505 |
| 2011/0253436 A1* | 10/2011 | Hasegawa | H01G 11/74 204/279 |
| 2013/0021021 A1* | 1/2013 | Ramirez | G01R 22/061 324/142 |
| 2013/0269993 A1* | 10/2013 | Yokozawa | H01G 9/0003 174/260 |
| 2015/0016021 A1* | 1/2015 | Lane | H01G 11/84 361/502 |
| 2017/0338055 A1 | 11/2017 | Knopsnyder et al. | |
| 2019/0259548 A1 | 8/2019 | Hansen | |
| 2019/0259549 A1 | 8/2019 | Hansen | |
| 2019/0304711 A1 | 10/2019 | Hansen | |

FOREIGN PATENT DOCUMENTS

| | | |
|---|---|---|
| JP | H 06176972 A | 6/1994 |
| JP | H 09129473 A | 5/1997 |
| JP | 2014003193 A | 1/2014 |
| KR | 101521802 B | 5/2015 |

OTHER PUBLICATIONS

Product Information from VINATech regarding Hy-Cap 2-Series Module, 2015, 2 pages.

Information from VINATech—High Density Moulded Supercapacitor Module Targets Intrinsically Safe Applications, Aug. 19, 2015, 1 page.

Product Information—New 7.5 V SCM Series Supercapacitor Modules from AVX Corporation, 100317, 8 pages.

Product Information—SCC LE Series SuperCapacitors from AVX Corporation, 101217, 8 pages.

Product Information—BestCap® Ultra-low ESR High Power Pulse Supercapacitors, 27 pages.

International Search Report and Written Opinion for PCT/US2019/018035 dated Jun. 14, 2019, 12 pages.

* cited by examiner

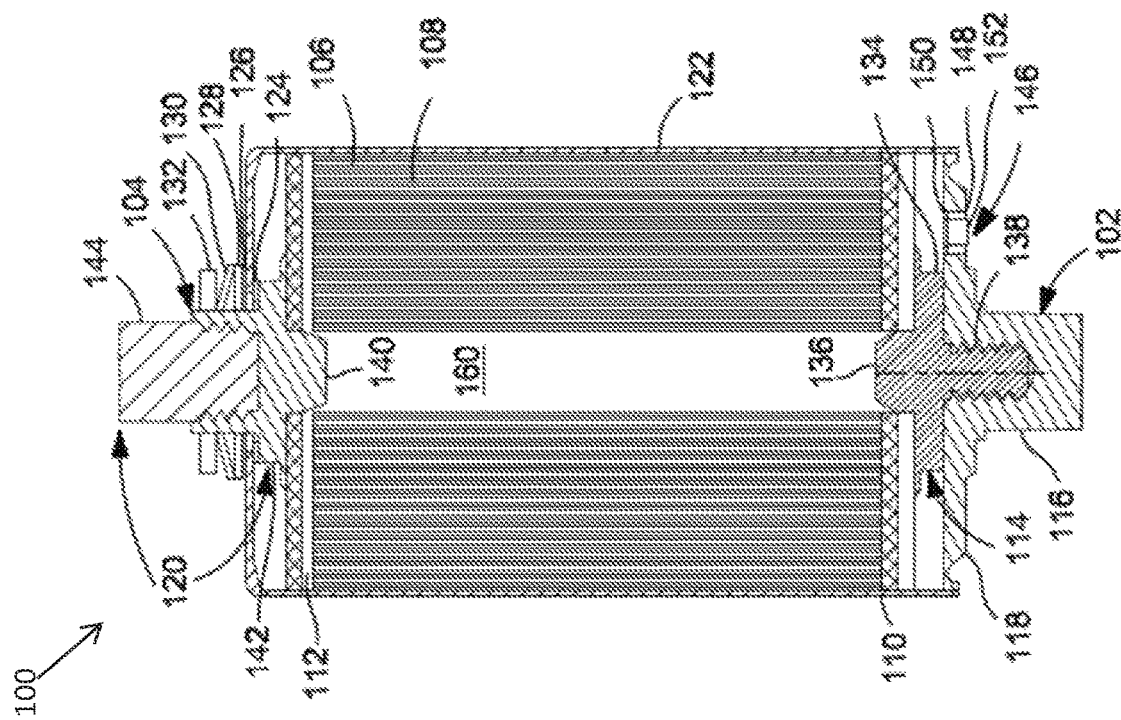

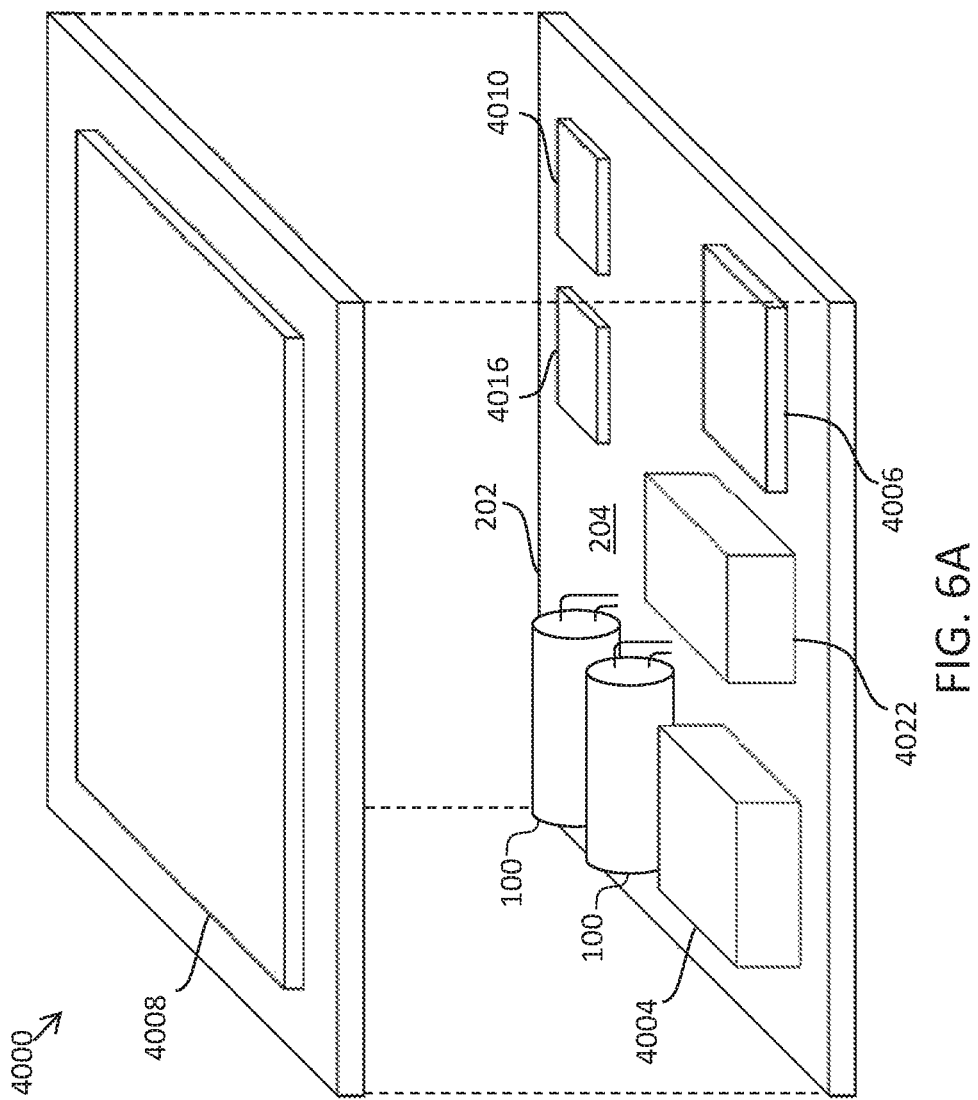

ELECTRICAL CIRCUIT INCLUDING A SUPERCAPACITOR WITH REDUCED LEAKAGE

CROSS REFERENCE TO RELATED APPLICATION

The present application claims filing benefit of U.S. Provisional Patent Application Ser. No. 62/633,811 having a filing date of Feb. 22, 2018, which is incorporated herein by reference in its entirety.

BACKGROUND OF THE INVENTION

Electrical energy storage cells are widely used to provide power to electronic, electromechanical, electrochemical, and other useful devices. A double layer supercapacitor, for instance, can employ a pair of polarizable electrodes that contain carbon particles (e.g., activated carbon) impregnated with a liquid electrolyte. Due to the effective surface area of the particles and the small spacing between the electrodes, large capacitance values can be achieved.

Electrical circuits may be formed on substrates, such as printed circuit boards (PCBs) by surface mounting various components to the substrate. Supercapacitors may be surface mounted to provide significant energy storage in a small form factor.

Heat and humidity, however, may accumulate in confined spaces between surface-mounted supercapacitors and PCBs that can cause corrosion or other damage. For example, supercapacitors can be connected to PCBs using electrical leads. Such leads may generate heat and even cause an electrolysis reaction in confined spaces between the supercapacitors and PCBs. As a result, hydrogen gas, oxygen gas, and water vapor can infiltrate and damage the supercapacitor.

SUMMARY

In accordance with one embodiment, an electrical circuit may include a substrate comprising a generally planar surface and a supercapacitor assembly. The supercapacitor assembly may include a container having a length in a longitudinal direction. The supercapacitor assembly may include an electrode assembly enclosed within the container, and the electrode assembly may have a jelly-roll configuration. An angle may be formed between the longitudinal direction of the container and the generally planar surface of the substrate. The angle may range from about 0 to about 30 degrees.

In accordance with another embodiment, a meter for measuring a flow of a product may include a substrate having a generally planar surface and a supercapacitor assembly. The supercapacitor assembly may include a container having a length in a longitudinal direction. The supercapacitor assembly may include an electrode assembly enclosed within the container and having a jelly-roll configuration. An angle may be formed between the longitudinal direction of the container and the generally planar surface of the substrate. The angle may range from about 0 to about 30 degrees.

In accordance with another embodiment, an electrical circuit includes a substrate and a supercapacitor assembly mounted to the substrate. The supercapacitor assembly includes a container having a length in a longitudinal direction. The supercapacitor assembly includes an electrode assembly enclosed within the container, and the electrode assembly has a jelly-roll configuration. The longitudinal direction of the supercapacitor generally extends in a horizontal direction.

Other features and aspects of the present disclosure are set forth in greater detail below.

BRIEF DESCRIPTION OF THE DRAWINGS

A full and enabling disclosure of the present disclosure, including the best mode thereof, directed to one of ordinary skill in the art, is set forth more particularly in the remainder of the specification, which makes reference to the appended figure in which:

FIGS. 1A and 1B illustrate schematic views of one embodiment of a supercapacitor assembly in accordance with aspects of the present invention;

FIG. 6A illustrates a perspective view of an embodiment of a meter for measuring power usage that includes a supercapacitor assembly in accordance with aspects of the present disclosure.

Figure 2A:
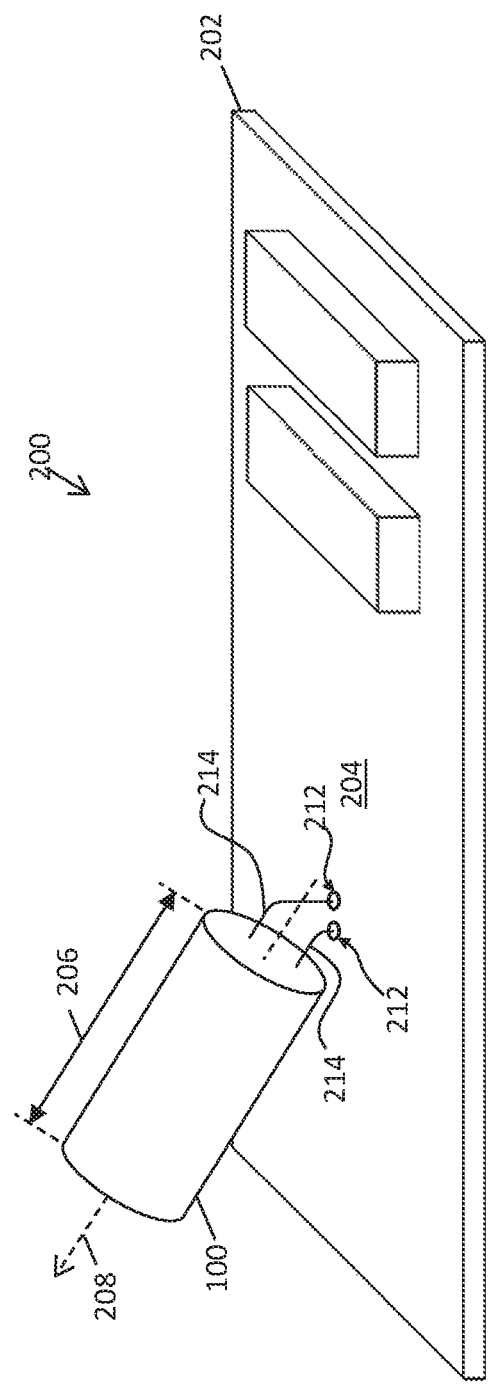
FIGS. 2A and 2B illustrate, respectively, a perspective view and side elevation view of one embodiment of an electrical circuit including a supercapacitor assembly in accordance with aspects of the present disclosure.

Repeat use of reference characters in the present specification and drawing is intended to represent same or analogous features or elements of the disclosure.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present disclosure, which broader aspects are embodied in the exemplary construction.

Aspects of the present disclosure are directed to an electrical circuit including a substrate, such a PCB. The substrate may have a generally planar surface. The electrical circuit may also include a supercapacitor assembly including a container having a length in a longitudinal direction. The supercapacitor assembly may include an electrode assembly enclosed within the container and having a jelly-roll configuration.

Regardless of the particular configuration employed, the present inventors have discovered that through selective control over the orientation of the supercapacitor assembly, a more robust electrical circuit may be obtained. For example, an angle may be formed between the longitudinal direction of the container of the supercapacitor and the generally planar surface of the substrate. In some embodiments, the angle may range about 0 to about 75 degrees, in some embodiments from about 0 to about 60 degrees, in some embodiments from about 0 to about 45 degrees, in some embodiments from about 0 to about 30 degrees, in some embodiments from about 0 to about 20 degrees, in some embodiments from about 0 to about 15 degrees, and in some embodiments from about 0 to about 10 degrees. For example, in some embodiments, the angle may be about 0 degrees.

In other words, in some embodiments, the supercapacitor assembly may generally extend in a direction parallel with the generally planar surface of the substrate. Such a configuration may reduce heat and/or humidity accumulation around electrical leads of the supercapacitor assembly (which may be located near an end of the container) and/or between the supercapacitor assembly and the substrate, thereby reducing or preventing corrosion damage.

In some embodiments, the supercapacitor assembly may generally extend in a horizontal direction such that gravity does not encourage leaking through various seals of the supercapacitor assembly. Such seals are located at one or both ends of the supercapacitor assembly. For example, seals may be located around leads extending through a housing of the supercapacitor assembly and/or between a lid and body of the housing of the supercapacitor assembly to seal the housing with the supercapacitor therein. This configuration may prevent or reduce leakage of the supercapacitor assembly.

Supercapacitor Configuration

Any of a variety of different individual supercapacitors may generally be employed in the module of the present invention. Generally speaking, however, the supercapacitor contains an electrode assembly and electrolyte contained and optionally hermetically sealed within a housing. The electrode assembly may, for instance, contain a first electrode that contains a first carbonaceous coating (e.g., activated carbon particles) electrically coupled to a first current collector, and a second electrode that contains a second carbonaceous coating (e.g., activated carbon particles) electrically coupled to a second current collector. It should be understood that additional current collectors may also be employed if desired, particularly if the supercapacitor includes multiple energy storage cells. The current collectors may be formed from the same or different materials. Regardless, each collector is typically formed from a substrate that includes a conductive metal, such as aluminum, stainless steel, nickel, silver, palladium, etc., as well as alloys thereof. Aluminum and aluminum alloys are particularly suitable for use in the present invention. The substrate may be in the form of a foil, sheet, plate, mesh, etc. The substrate may also have a relatively small thickness, such as about 200 micrometers or less, in some embodiments from about 1 to about 100 micrometers, in some embodiments from about 5 to about 80 micrometers, and in some embodiments, from about 10 to about 50 micrometers. Although by no means required, the surface of the substrate may be optionally roughened, such as by washing, etching, blasting, etc. The use of the term "about" in conjunction with a numerical value is intended to refer to within 20% of the stated amount.

First and second carbonaceous coatings may also be electrically coupled to the first and second current collectors, respectively. While they may be formed from the same or different types of materials and may contain one or multiple layers, each of the carbonaceous coatings generally contains at least one layer that includes activated particles. In certain embodiments, for instance, the activated carbon layer may be directly positioned over the current collector and may optionally be the only layer of the carbonaceous coating. Examples of suitable activated carbon particles may include, for instance, coconut shell-based activated carbon, petroleum coke-based activated carbon, pitch-based activated carbon, polyvinylidene chloride-based activated carbon, phenolic resin-based activated carbon, polyacrylonitrile-based activated carbon, and activated carbon from natural sources such as coal, charcoal or other natural organic sources.

In certain embodiments, it may be desired to selectively control certain aspects of the activated carbon particles, such as their particle size distribution, surface area, and pore size distribution to help improve ion mobility for certain types of electrolytes after being subjected to one or more charge-discharge cycles. For example, at least 50% by volume of the particles (D50 size) may have a size in the range of from about 0.01 to about 30 micrometers, in some embodiments from about 0.1 to about 20 micrometers, and in some embodiments, from about 0.5 to about 10 micrometers. At least 90% by volume of the particles (D90 size) may likewise have a size in the range of from about 2 to about 40 micrometers, in some embodiments from about 5 to about 30 micrometers, and in some embodiments, from about 6 to about 15 micrometers. The BET surface may also range from about 900 $m^2/g$ to about 3,000 $m^2/g$, in some embodiments from about 1,000 $m^2/g$ to about 2,500 $m^2/g$, and in some embodiments, from about 1,100 $m^2/g$ to about 1,800 $m^2/g$.

In addition to having a certain size and surface area, the activated carbon particles may also contain pores having a certain size distribution. For example, the amount of pores less than about 2 nanometers in size (i.e., "micropores") may provide a pore volume of about 50 vol. % or less, in some embodiments about 30 vol. % or less, and in some embodiments, from 0.1 vol. % to 15 vol. % of the total pore volume. The amount of pores between about 2 nanometers and about 50 nanometers in size (i.e., "mesopores") may likewise be from about 20 vol. % to about 80 vol. %, in some embodiments from about 25 vol. % to about 75 vol. %, and in some embodiments, from about 35 vol. % to about 65 vol. %. Finally, the amount of pores greater than about 50 nanometers in size (i.e., "macropores") may be from about 1 vol. % to about 50 vol. %, in some embodiments from about 5 vol. % to about 40 vol. %, and in some embodiments, from about 10 vol. % to about 35 vol. %. The total pore volume of the carbon particles may be in the range of from about 0.2 $cm^3/g$ to about 1.5 $cm^3/g$, and in some embodiments, from about 0.4 $cm^3/g$ to about 1.0 $cm^3/g$, and the median pore width may be about 8 nanometers or less, in some embodiments from about 1 to about 5 nanometers, and in some embodiments, from about 2 to about 4 nanometers. The pore sizes and total pore volume may be measured using nitrogen adsorption and analyzed by the Barrett-Joyner-Halenda ("BJH") technique as is well known in the art.

If desired, binders may be present in an amount of about 60 parts or less, in some embodiments 40 parts or less, and in some embodiments, from about 1 to about 25 parts per 100 parts of carbon in the first and/or second carbonaceous coatings. Binders may, for example, constitute about 15 wt. % or less, in some embodiments about 10 wt. % or less, and in some embodiments, from about 0.5 wt. % to about 5 wt. % of the total weight of a carbonaceous coating. Any of a variety of suitable binders can be used in the electrodes. For instance, water-insoluble organic binders may be employed in certain embodiments, such as styrene-butadiene copolymers, polyvinyl acetate homopolymers, vinyl-acetate ethylene copolymers, vinyl-acetate acrylic copolymers, ethylene-vinyl chloride copolymers, ethylene-vinyl chloride-vinyl acetate terpolymers, acrylic polyvinyl chloride polymers, acrylic polymers, nitrile polymers, fluoropolymers such as polytetrafluoroethylene or polyvinylidene fluoride, polyolefins, etc., as well as mixtures thereof. Water-soluble organic binders may also be employed, such as polysaccharides and derivatives thereof. In one particular embodiment, the polysaccharide may be a nonionic cellulosic ether, such as alkyl cellulose ethers (e.g., methyl cellulose and ethyl cellulose); hydroxyalkyl cellulose ethers (e.g., hydroxyethyl cellulose, hydroxypropyl cellulose, hydroxypropyl hydroxybutyl cellulose, hydroxyethyl hydroxypropyl cellulose, hydroxyethyl hydroxybutyl cellulose, hydroxyethyl hydroxypropyl hydroxybutyl cellulose, etc.); alkyl hydroxyalkyl cellulose ethers (e.g., methyl hydroxyethyl cellulose, methyl hydroxypropyl cellulose, ethyl hydroxyethyl cellulose, ethyl hydroxypropyl cellulose, methyl ethyl hydroxyethyl cellulose and methyl ethyl hydroxypropyl cellulose); carboxyalkyl cellulose ethers (e.g., carboxymethyl cellulose); and so forth, as well as protonated salts of any of the foregoing, such as sodium carboxymethyl cellulose.

Other materials may also be employed within an activated carbon layer of the first and/or second carbonaceous coatings and/or within other layers of the first and/or second carbonaceous coatings. For example, in certain embodiments, a conductivity promoter may be employed to further increase electrical conductivity. Exemplary conductivity promoters may include, for instance, carbon black, graphite (natural or artificial), graphite, carbon nanotubes, nanowires or nanotubes, metal fibers, graphenes, etc., as well as mixtures thereof. Carbon black is particularly suitable. When employed, conductivity promoters typically constitute about 60 parts or less, in some embodiments 40 parts or less, and in some embodiments, from about 1 to about 25 parts per 100 parts of the activated carbon particles in a carbonaceous coating. Conductivity promoters may, for example, constitute about 15 wt. % or less, in some embodiments about 10 wt. % or less, and in some embodiments, from about 0.5 wt. % to about 5 wt. % of the total weight of a carbonaceous coating. Activated carbon particles likewise typically constitute 85 wt. % or more, in some embodiments about 90 wt. % or more, and in some embodiments, from about 95 wt. % to about 99.5 wt. % of a carbonaceous coating.

The particular manner in which a carbonaceous coating is applied to a current collector may vary as is well known to those skilled in the art, such as printing (e.g., rotogravure), spraying, slot-die coating, drop-coating, dip-coating, etc. Regardless of the manner in which it is applied, the resulting electrode is typically dried to remove moisture from the coating, such as at a temperature of about 100° C. or more, in some embodiments about 200° C. or more, and in some embodiments, from about 300° C. to about 500° C. The electrode may also be compressed (e.g., calendered) to optimize the volumetric efficiency of the supercapacitor. After any optional compression, the thickness of each carbonaceous coating may generally vary based on the desired electrical performance and operating range of the supercapacitor. Typically, however, the thickness of a coating is from about 20 to about 200 micrometers, 30 to about 150 micrometers, and in some embodiments, from about 40 to about 100 micrometers. Coatings may be present on one or both sides of a current collector. Regardless, the thickness of the overall electrode (including the current collector and the carbonaceous coating(s) after optional compression) is typically within a range of from about 20 to about 350 micrometers, in some embodiments from about 30 to about 300 micrometers, and in some embodiments, from about 50 to about 250 micrometers.

The electrode assembly also typically contains a separator that is positioned between the first and second electrodes. If desired, other separators may also be employed in the electrode assembly. For example, one or more separators may be positioned over the first electrode, the second electrode, or both. The separators enable electrical isolation of one electrode from another to help prevent an electrical short, but still allow transport of ions between the two electrodes. In certain embodiments, for example, a separator may be employed that includes a cellulosic fibrous material (e.g., airlaid paper web, wet-laid paper web, etc.), nonwoven fibrous material (e.g., polyolefin nonwoven webs), woven fabrics, film (e.g., polyolefin film), etc. Cellulosic fibrous materials are particularly suitable for use in the supercapacitor, such as those containing natural fibers, synthetic fibers, etc. Specific examples of suitable cellulosic fibers for use in the separator may include, for instance, hardwood pulp fibers, softwood pulp fibers, rayon fibers, regenerated cellulosic fibers, etc. Regardless of the particular materials employed, the separator typically has a thickness of from about 5 to about 150 micrometers, in some embodiments from about 10 to about 100 micrometers, and in some embodiments, from about 20 to about 80 micrometers.

The manner in which the components of the electrode assembly are combined together may vary as is known in the art. For example, the electrodes and separator may be initially folded, wound, or otherwise contacted together to form an electrode assembly. In one particular embodiment, the electrodes, separator, and optional electrolyte may be wound into an electrode assembly having a "jelly-roll" configuration. Referring to FIG. 1A, for instance, one embodiment of such a jellyroll electrode assembly 1100 is shown that contains a first electrode 1102, second electrode 1104, and a separator 1106 positioned between the electrodes 1102 and 1104. In this particular embodiment, the electrode assembly 1100 also includes another separator 1108 that is positioned over the second electrode 1104. In this manner, each of two coated surfaces of the electrodes is separated by a separator, thereby maximizing surface area per unit volume and capacitance. While by no means required, the electrodes 1102 and 1104 are offset in this embodiment so as to leave their respective contact edges extending beyond first and second edges of the first and second separators 1106 and 1108, respectively. Among other things, this can help prevent "shorting" due to the flow of electrical current between the electrodes.

To form a supercapacitor, an electrolyte is placed into ionic contact with the first electrode and the second electrode before, during, and/or after the electrodes and separator are combined together to form the electrode assembly. The electrolyte is generally nonaqueous in nature and thus contains at least one nonaqueous solvent. To help extend the operating temperature range of the supercapacitor, it is typically desired that the nonaqueous solvent have a relatively high boiling temperature, such as about 150° C. or more, in some embodiments about 200° C. or more, and in some embodiments, from about 220° C. to about 300° C. Particularly suitable high boiling point solvents may include, for instance, cyclic carbonate solvents, such as ethylene carbonate, propylene carbonate, butylene carbonate, vinylene carbonate, etc. Of course, other nonaqueous solvents may also be employed, either alone or in combination with a cyclic carbonate solvent. Examples of such solvents may include, for instance, open-chain carbonates (e.g., dimethyl carbonate, ethyl methyl carbonate, diethyl carbonate, etc.), aliphatic monocarboxylates (e.g., methyl acetate, methyl propionate, etc.), lactone solvents (e.g., butyrolactone valerolactone, etc.), nitriles (e.g., acetonitrile, glutaronitrile, adiponitrile, methoxyacetonitrile, 3-methoxypropionitrile, etc.), amides (e.g., N,N-dimethylformamide, N,N-diethylacetamide, N-methylpyrrolidinone), alkanes (e.g., nitromethane, nitroethane, etc.), sulfur compounds (e.g., sulfolane, dimethyl sulfoxide, etc.); and so forth.

The electrolyte may also contain at least one ionic liquid, which is dissolved in the nonaqueous solvent. While the concentration of the ionic liquid can vary, it is typically desired that the ionic liquid is present at a relatively high concentration. For example, the ionic liquid may be present in an amount of about 0.8 moles per liter (M) of the electrolyte or more, in some embodiments about 1.0 M or more, in some embodiments about 1.2 M or more, and in some embodiments, from about 1.3 to about 1.8 M.

The ionic liquid is generally a salt having a relatively low melting temperature, such as about 400° C. or less, in some embodiments about 350° C. or less, in some embodiments from about 1° C. to about 100° C., and in some embodiments, from about 5° C. to about 50° C. The salt contains a cationic species and counterion. The cationic species contains a compound having at least one heteroatom (e.g., nitrogen or phosphorous) as a "cationic center." Examples of such heteroatomic compounds include, for instance, unsubstituted or substituted organoquaternary ammonium compounds, such as ammonium (e.g., trimethylammonium, tetraethylammonium, etc.), pyridinium, pyridazinium, pyramidinium, pyrazinium, imidazolium, pyrazolium, oxazolium, triazolium, thiazolium, quinolinium, piperidinium, pyrrolidinium, quaternary ammonium spiro compounds in which two or more rings are connected together by a spiro atom (e.g., carbon, heteroatom, etc.), quaternary ammonium fused ring structures (e.g., quinolinium, isoquinolinium, etc.), and so forth. In one particular embodiment, for example, the cationic species may be an N-spirobicyclic compound, such as symmetrical or asymmetrical N-spirobicyclic compounds having cyclic rings. One example of such a compound has the following structure:

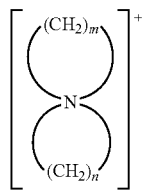

wherein m and n are independently a number from 3 to 7, and in some embodiments, from 4 to 5 (e.g., pyrrolidinium or piperidinium).

Suitable counterions for the cationic species may likewise include halogens (e.g., chloride, bromide, iodide, etc.); sulfates or sulfonates (e.g., methyl sulfate, ethyl sulfate, butyl sulfate, hexyl sulfate, octyl sulfate, hydrogen sulfate, methane sulfonate, dodecylbenzene sulfonate, dodecylsulfate, trifluoromethane sulfonate, heptadecafluorooctanesulfonate, sodium dodecylethoxysulfate, etc.); sulfosuccinates; amides (e.g., dicyanamide); imides (e.g., bis(pentafluoroethyl-sulfonyl)imide, bis(trifluoromethylsulfonyl)imide, bis(trifluoromethyl)imide, etc.); borates (e.g., tetrafluoroborate, tetracyanoborate, bis[oxalato]borate, bis[salicylato]borate, etc.); phosphates or phosphinates (e.g., hexafluorophosphate, diethylphosphate, bis(pentafluoroethyl)phosphinate, tris(pentafluoroethyl)-trifluorophosphate, tris(nonafluorobutyl)trifluorophosphate, etc.); antimonates (e.g., hexafluoroantimonate); aluminates (e.g., tetrachloroaluminate); fatty acid carboxylates (e.g., oleate, isostearate, pentadecafluorooctanoate, etc.); cyanates; acetates; and so forth, as well as combinations of any of the foregoing.

Several examples of suitable ionic liquids may include, for instance, spiro-(1,1')-bipyrrolidinium tetrafluoroborate, triethylmethyl ammonium tetrafluoroborate, tetraethyl ammonium tetrafluoroborate, spiro-(1,1')-bipyrrolidinium iodide, triethylmethyl ammonium iodide, tetraethyl ammonium iodide, methyltriethylammonium tetrafluoroborate, tetrabutylammonium tetrafluoroborate, tetraethylammonium hexafluorophosphate, etc.

As noted above, the supercapacitor also contains a housing within which the electrode assembly and electrolyte are retained and optionally hermetically sealed. The nature of the housing may vary as desired. In one embodiment, for example, the housing may contain a metal container ("can"), such as those formed from tantalum, niobium, aluminum, nickel, hafnium, titanium, copper, silver, steel (e.g., stainless), alloys thereof, composites thereof (e.g., metal coated with electrically conductive oxide), and so forth. Aluminum is particularly suitable for use in the present invention. The metal container may have any of a variety of different shapes, such as cylindrical, D-shaped, etc. Cylindrically-shaped containers are particular suitable.

The electrode assembly may be sealed within the cylindrical housing using a variety of different techniques. The nature of the housing may vary as desired. In one embodiment, for example, the housing may contain a metal container ("can"), such as those formed from tantalum, niobium, aluminum, nickel, hafnium, titanium, copper, silver, steel (e.g., stainless), alloys thereof, composites thereof (e.g., metal coated with electrically conductive oxide), and so forth. Aluminum is particularly suitable. In other embodiments, the housing may include any suitable plastic material (e.g., polypropylene (PP), high-density polyethylene (HDPE), low-density polyethylene (LDPE), etc.). The container may have any of a variety of different shapes, such as cylindrical, D-shaped, etc. Cylindrically-shaped containers are particular suitable.

Referring to FIG. 1B, one embodiment of a supercapacitor assembly 100 is shown that contains an electrode assembly 108, which contains layers 106 wound together in a jellyroll configuration. In this particular embodiment, the supercapacitor contains a first collector disc 114, which contains a disc-shaped portion 134, a stud portion 136, and a fastener 138 (e.g., screw). The collector disc 114 is aligned with a first end of a hollow core 160, which is formed in the center of the electrode assembly, and the stud portion 136 is then inserted into an opening of the core so that the disc-shaped portion 134 sits against the first end of the electrode assembly 108 at a first contact edge 110. A lid 118 is welded (e.g., laser welded) to a first terminal post 116, and a socket, which may be for example, threaded, is coupled to the fastener 138. The supercapacitor also contains a second collector disc 120, which contains a disc-shaped portion 142, a stud portion 140, and a second terminal post 144. The second collector disc 120 is aligned with the second end of the hollow core 160, and the stud portion 140 is then inserted into the opening of the core so that the collector disc portion 142 sits against the second end of the electrode assembly 108.

A container 122 (e.g., cylindrically-shaped can) is thereafter slid over the electrode assembly 108 so that the second collector disc 120 enters the container 122 first, passes through a first insulating washer 124, passes through an axial hole at an end of the container 122, and then passes through a second insulating washer 126. The second collector disc 120 also passes through a flat washer 128 and a spring washer 130. A locknut 132 is tightened over the spring washer 130, which compresses the spring washer 130 against the flat washer 128, which in turn is compressed against the second insulating washer 126. The second insulating washer 126 is compressed against the exterior periphery of the axial hole in the metal container 122, and as the second collector disc 120 is drawn by this compressive force toward the axial hole, the first insulating washer 124 is compressed between the second collector disc 120 and an interior periphery of the axial hole in the container 122. A flange on the first insulating washer 124 inhibits electrical contact between the second collector disc 120 and a rim of the axial hole. Simultaneously, the lid 118 is drawn into an opening of the container 122 so that a rim of the lid 118 sits just inside a lip of the opening of the container 122. The rim of the lid 118 is then welded to the lip of the opening of the container 122.

Once the locknut 132 is tightened against the spring washer 130, a hermetic seal may be formed between the axial hole, the first insulating washer 124, the second insulating washer 126, and the second collector disc 120. Similarly, the welding of the lid 118 to the lip of the container 122, and the welding of the lid 118 to the first terminal post 116, may form another hermetic seal. A hole 146 in the lid 118 can remain open to serve as a fill port for the electrolyte described above. Once the electrolyte is in the can (i.e., drawn into the can under vacuum, as described above), a bushing 148 is inserted into the hole 146 and seated against a flange 150 at an interior edge of the hole 146. The bushing 148 may, for instance, be a hollow cylinder in shape, fashioned to receive a plug 152. The plug 152, which is cylindrical in shape, is pressed into a center of the bushing 148, thereby compressing the bushing 148 against an interior of the hole 146 and forming a hermetic seal between the hole 146, the bushing 148, and the plug 152. The plug 152 and the bushing 148 may be selected to dislodge when a prescribed level of pressure is reached within the supercapacitor, thereby forming an overpressure safety mechanism.

The embodiments described above generally refer to the use of a single electrochemical cell in the capacitor. It should of course be understood, however, that the capacitor of the present invention may also contain two or more electrochemical cells. In one such embodiment, for example, the capacitor may include a stack of two or more electrochemical cells, which may be the same or different.

The resulting supercapacitor can exhibit excellent electrical properties. For example, the supercapacitor may exhibit a capacitance of about 6 Farads per cubic centimeter ("F/cm$^3$") or more, in some embodiments about 8 F/cm$^3$ or more, in some embodiments from about 9 to about 100 F/cm$^3$, and in some embodiments, from about 10 to about 80 F/cm$^3$, measured at a temperature of 23° C., frequency of 120 Hz, and without an applied voltage. The supercapacitor may also have a low equivalence series resistance (ESR), such as about 150 mohms or less, in some embodiments less than about 125 mohms, in some embodiments from about 0.01 to about 100 mohms, and in some embodiments, from about 0.05 to about 70 mohms, determined at a temperature of 23° C., frequency of 100 kHz, and without an applied voltage.

Notably, the supercapacitor may also exhibit excellent electrical properties even when exposed to high temperatures. For example, the supercapacitor may be placed into contact with an atmosphere having a temperature of from about 80° C. or more, in some embodiments from about 100° C. to about 150° C., and in some embodiments, from about 105° C. to about 130° C. (e.g., 85° C. or 105° C.). The capacitance and ESR values can remain stable at such temperatures for a substantial period of time, such as for about 100 hours or more, in some embodiments from about 300 hours to about 5000 hours, and in some embodiments, from about 600 hours to about 4500 hours (e.g., 168, 336, 504, 672, 840, 1008, 1512, 2040, 3024, or 4032 hours).

In one embodiment, for example, the ratio of the capacitance value of the supercapacitor after being exposed to the hot atmosphere (e.g., 85° C. or 105° C.) for 1008 hours to the capacitance value of the supercapacitor when initially exposed to the hot atmosphere is about 0.75 or more, in some embodiments from about 0.8 to 1.0, and in some embodiments, from about 0.85 to 1.0. Such high capacitance values can also be maintained under various extreme conditions, such as when applied with a voltage and/or in a humid atmosphere. For example, the ratio of the capacitance value of the supercapacitor after being exposed to the hot atmosphere (e.g., 85° C. or 105° C.) and an applied voltage to the initial capacitance value of the supercapacitor when exposed to the hot atmosphere but prior to being applied with the voltage may be about 0.60 or more, in some embodiments from about 0.65 to 1.0, and in some embodiments, from about 0.7 to 1.0. The voltage may, for instance, be about 1 volt or more, in some embodiments about 1.5 volts or more, and in some embodiments, from about 2 to about 10 volts (e.g., 2.1 volts). In one embodiment, for example, the ratio noted above may be maintained for 1008 hours or more. The supercapacitor may also maintain the capacitance values noted above when exposed to high humidity levels, such as when placed into contact with an atmosphere having a relative humidity of about 40% or more, in some embodiments about 45% or more, in some embodiments about 50% or more, and in some embodiments, about 70% or more (e.g., about 85% to 100%). Relative humidity may, for instance, be determined in accordance with ASTM E337-02, Method A (2007). For example, the ratio of the capacitance value of the supercapacitor after being exposed to the hot atmosphere (e.g., 85° C. or 105° C.) and high humidity (e.g., 85%) to the initial capacitance value of the supercapacitor when exposed to the hot atmosphere but prior to being exposed to the high humidity may be about 0.7 or more, in some embodiments from about 0.75 to 1.0, and in some embodiments, from about 0.80 to 1.0. In one embodiment, for example, this ratio may be maintained for 1008 hours or more.

The ESR can also remain stable at such temperatures for a substantial period of time, such as noted above. In one embodiment, for example, the ratio of the ESR of the supercapacitor after being exposed to the hot atmosphere (e.g., 85° C. or 105° C.) for 1008 hours to the ESR of the supercapacitor when initially exposed to the hot atmosphere is about 1.5 or less, in some embodiments about 1.2 or less, and in some embodiments, from about 0.2 to about 1. Notably, such low ESR values can also be maintained under various extreme conditions, such as when applied with a high voltage and/or in a humid atmosphere as described above. For example, the ratio of the ESR of the supercapacitor after being exposed to the hot atmosphere (e.g., 85° C. or 105° C.) and an applied voltage to the initial ESR of the supercapacitor when exposed to the hot atmosphere but prior to being applied with the voltage may be about 1.8 or less, in some embodiments about 1.7 or less, and in some embodiments, from about 0.2 to about 1.6. In one embodiment, for example, the ratio noted above may be maintained for 1008 hours or more. The supercapacitor may also maintain the ESR values noted above when exposed to high humidity levels. For example, the ratio of the ESR of the supercapacitor after being exposed to the hot atmosphere (e.g., 85° C. or 105° C.) and high humidity (e.g., 85%) to the initial capacitance value of the supercapacitor when exposed to the hot atmosphere but prior to being exposed to the high humidity may be about 1.5 or less, in some embodiments about 1.4 or less, and in some embodiments, from about 0.2 to about 1.2. In one embodiment, for example, this ratio may be maintained for 1008 hours or more.

In some embodiments, the supercapacitor may have a capacitance ranging from about 1 F to about 1,500 F, in some embodiments from about 100 F to about 1,000 F. In some embodiments, the supercapacitor may have an operating voltage ranging from about 2 V to about 4 V, such as about 2.7 V.

The supercapacitor may be any suitable size and shape. For example, in some embodiments, the container of the supercapacitor may have a length ranging from about 10 mm to about 250 mm, in some embodiments from about 20 mm to about 120 mm. In some embodiments, the container of the supercapacitor may have a generally cylindrical shape, and a diameter ranging from about 3 mm to about 70 mm, and in some embodiments from about 8 mm to about 40 mm.

Casing

In some embodiments, a casing (e.g., an encapsulant layer) may be formed over the housing of the supercapacitor assembly, for example from a thermoset resin. Examples of such resins include, for instance, epoxy resins, polyimide resins, melamine resins, urea-formaldehyde resins, polyurethane resins, phenolic resins, polyester resins, etc. Epoxy resins are also particularly suitable for use in the encapsulant layer. Examples of suitable epoxy resins include, for instance, glycidyl ether type epoxy resins, such as bisphenol A type epoxy resins, bisphenol F type epoxy resins, phenol novolac type epoxy resins, orthocresol novolac type epoxy resins, brominated epoxy resins and biphenyl type epoxy resins, cyclic aliphatic epoxy resins, glycidyl ester type epoxy resins, glycidylamine type epoxy resins, cresol novolac type epoxy resins, naphthalene type epoxy resins, phenol aralkyl type epoxy resins, cyclopentadiene type epoxy resins, heterocyclic epoxy resins, etc.

If desired, curing agents may also be employed in the encapsulant layer to help promote curing. When employed, the curing agents typically constitute from about 0.1 to about 20 wt. % of the encapsulant layer. Exemplary curing agents include, for instance, amines, peroxides, anhydrides, phenol compounds, silanes, acid anhydride compounds and combinations thereof. Specific examples of suitable curing agents are dicyandiamide, 1-(2 cyanoethyl) 2-ethyl-4-methylimidazole, 1-benzyl 2-methylimidazole, ethyl cyano propyl imidazole, 2-methylimidazole, 2-phenylimidazole, 2-ethyl-4-methylimidazole, 2-undecylimidazole, 1-cyanoethyl-2-methylimidazole, 2,4-dicyano-6,2-methylimidazolyl-(1)-ethyl-s-triazine and 2,4-dicyano-6,2-undecylimidazolyl-(1)-ethyl-s-triazine, imidazolium salts (such as 1-cyanoethyl-2-undecylimidazolium trimellitate, 2-methylimidazolium isocyanurate, 2-ethyl-4-methylimidazolium tetraphenylborate, and 2-ethyl-1,4-dimethylimidazolium tetraphenylborate, etc. Still other useful curing agents include phosphine compounds, such as tributylphosphine, triphenylphosphine, tris(dimethoxyphenyl)phosphine, tris(hydroxypropyl)phosphine, and tris(cyanoethyl)phsphine; phosphonium salts, such as tetraphenylphosphonium-tetraphenylborate, methyltributylphosphonium-tetraphenylborate, and methyltricyanoethylphosphonium tetraphenylborate); amines, such as 2,4,6-tris(dimethylaminomethyl) phenol, benzylmethylamine, tetramethylbutylguanidine, N-methylpiperazine, and 2-dimethylamino-1-pyrroline; ammonium salts, such as triethylammonium tetraphenylborate; diazabicyclo compounds, such as 1,5-diazabicyclo[5, 4,0]-7-undecene, 1,5-diazabicyclo[4,3,0]-5-nonene, and 1,4-diazabicyclo[2,2,2]-octane; salts of diazabicyclo compounds such as tetraphenylborate, phenol salt, phenolnovolac salt, and 2-ethylhexanoic acid salt; and so forth.

Still other additives may also be employed, such as photoinitiators, viscosity modifiers, suspension aiding agents, pigments, stress reducing agents, non-conductive fillers, stabilizers, etc. Suitable photoinitiators may include, for instance, benzoin, benzoin methyl ether, benzoin ethyl ether, benzoin n-propyl ether, benzoin isobutyl ether, 2,2 dihydroxy-2-phenylacetophenone, 2,2-dimethoxy-2-phenylacetophenone 2,2-diethoxy-2-phenylacetophenone, 2,2-diethoxyacetophenone, benzophenone, 4,4-bisdialylaminobenzophenone, 4-dimethylaminobenzoic acid, alkyl 4-dimethylaminobenzoate, 2-ethylanthraquinone, xanthone, thioxanthone, 2-cholorothioxanthone, etc. Likewise, the non-conductive fillers may include inorganic oxide particles, such as silica, alumina, zirconia, magnesium oxide, iron oxide, copper oxide, zeolites, silicates, clays (e.g., smectite clay), etc., as well as composites (e.g., alumina-coated silica particles) and mixtures thereof. In certain embodiments, fillers that contain a silicon atom, such as silica and/or silicates, may be particularly suitable to enhance the ability of the barrier layer to bond to the encapsulant layer, such as through a silicon-oxygen bond. When employed, such fillers may, for instance, constitute from about 20 wt. % to about 95 wt. %, and in some embodiments, from about 50 wt. % to about 85 wt. % of the encapsulant layer.

Electrical Circuit

Figure 2B:
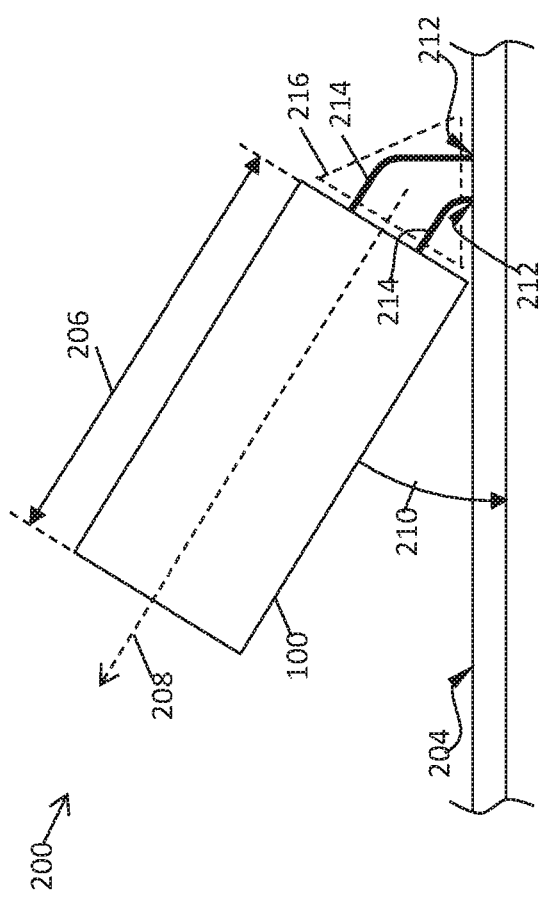

FIGS. 2A and 2B illustrate an electrical circuit 200 in accordance with aspects of the present disclosure. The electrical circuit 200 may include a substrate 202 having a generally planar surface 204. For example, in some embodiments, the substrate 202 may be a printed circuit board having internal and/or surface-printed electrical connections as is known in the art.

A supercapacitor assembly 100 may be mounted to the substrate 202 or otherwise configured to be supported adjacent the substrate 202. Any suitable mounting structure may be used to mount the supercapacitor assembly 100 to the substrate 202. Such mounting structure is omitted from the Figures for clarity. The supercapacitor assembly 100 may include a container 205 having a length 206 in a longitudinal direction 208. Referring to FIG. 2B, an angle 210 may be formed between the longitudinal direction 208 of the container 205 of the supercapacitor assembly 100 and the generally planar surface 204 of the substrate 202. As discussed above, in some embodiments, the angle 210 may range from about 0 to about 75 degrees.

In some embodiments, the substrate 202 may include a pair of electrical connections 212. For example, in some embodiments, the electrical connections 212 may include solder pads, sockets, etc. In some embodiments, the supercapacitor assembly 100 may include a pair of leads 214. Each lead 214 may be electrically connected with respective ones of the pair of electrical connections 212. The leads 214 may also be connected with the electrodes within the supercapacitor assembly 100. In some embodiments, an area 216 (illustrated by dotted lines forming a triangle) that is adjacent the electrical leads 214 and/or between the supercapacitor assembly 100 and the substrate 202 may be generally open to air circulation (e.g., through natural convection). As discussed above, in some embodiments, airflow adjacent the electrical leads 214 and/or between the supercapacitor assembly 100 and the substrate 202 may reduce heat and/or humidity accumulation. This may prevent corrosion or other damage to the supercapacitor assembly 100 and/or substrate 202.

Figure 3A:
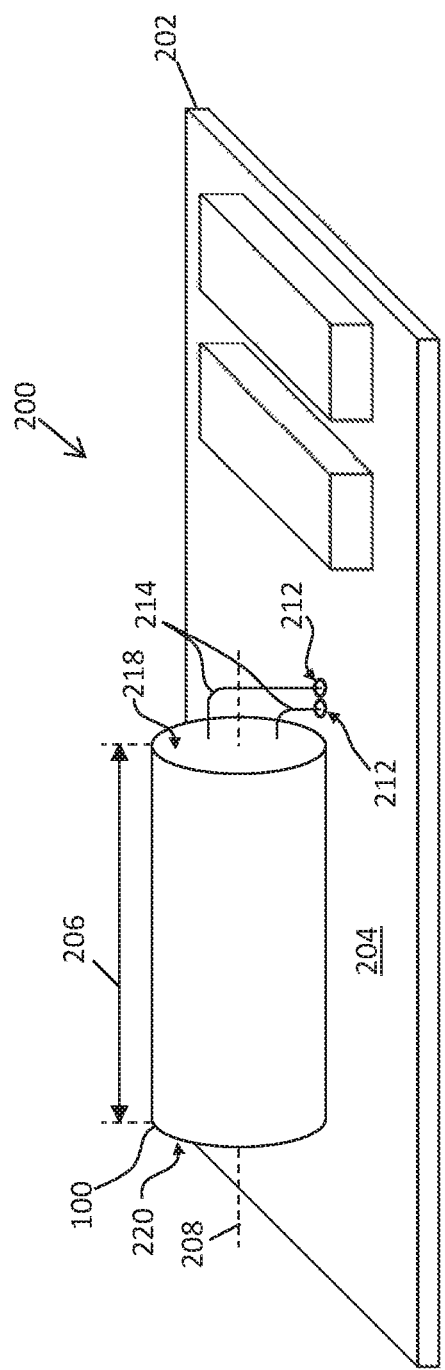
FIGS. 3A and 3B illustrate, respectively, a perspective view and side elevation view of another embodiment of an electrical circuit including a supercapacitor assembly in accordance with aspects of the present disclosure.
Figure 3B:
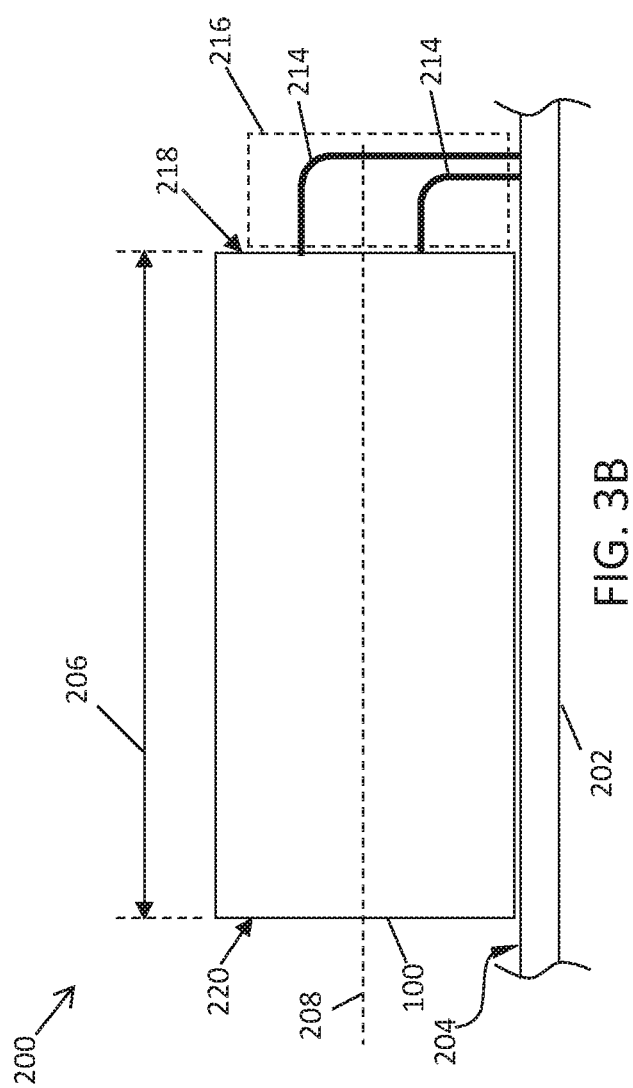

Referring to FIGS. 3A and 3B, in some embodiments, the angle between the longitudinal direction 208 of the container 205 of the supercapacitor assembly 100 and the generally planar surface 204 of the substrate 202 may be about 0 degrees. In other words, the supercapacitor assembly 100 may generally extend in a direction that is parallel with the generally planar surface 204 of the substrate 202. The supercapacitor assembly 100 may include a first end face 218 and a second end face 220. Each of the pair of electrical leads 214 may extend from the first end face 218. The area 216 adjacent the electrical leads 214 be generally open to airflow (e.g., through natural convection). This may prevent heat and/or humidity accumulation, thereby preventing damage to the supercapacitor assembly 100 and/or substrate 202 (e.g., from water vapor and gas produced by electrolysis).

Figure 4A:
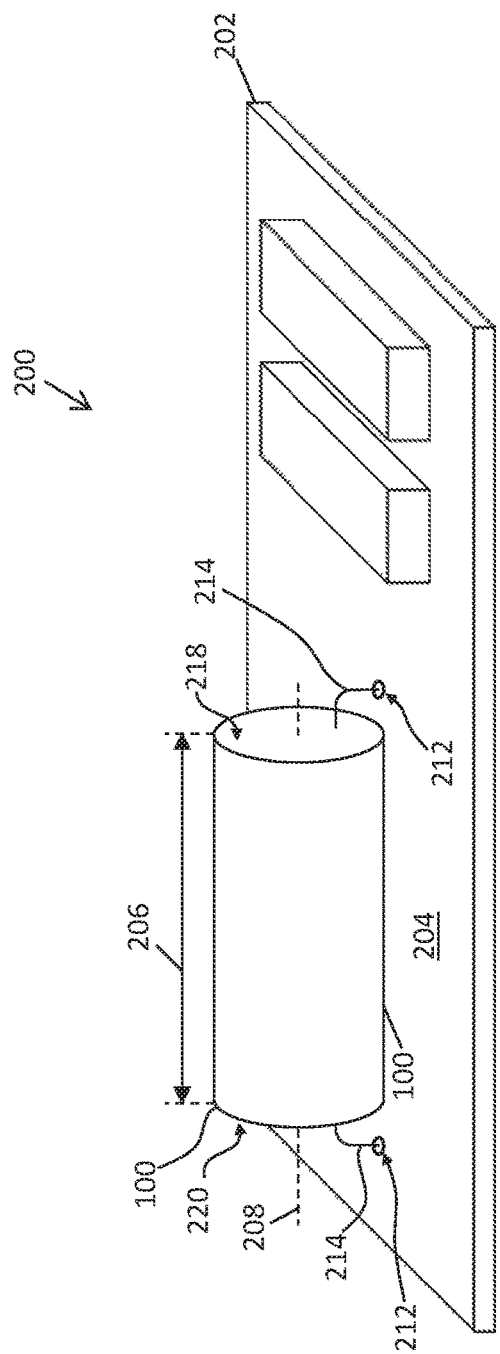
FIGS. 4A and 4B illustrate, respectively, a perspective view and side elevation view of another embodiment of an electrical circuit including a supercapacitor assembly in accordance with aspects of the present disclosure.
Figure 4B:
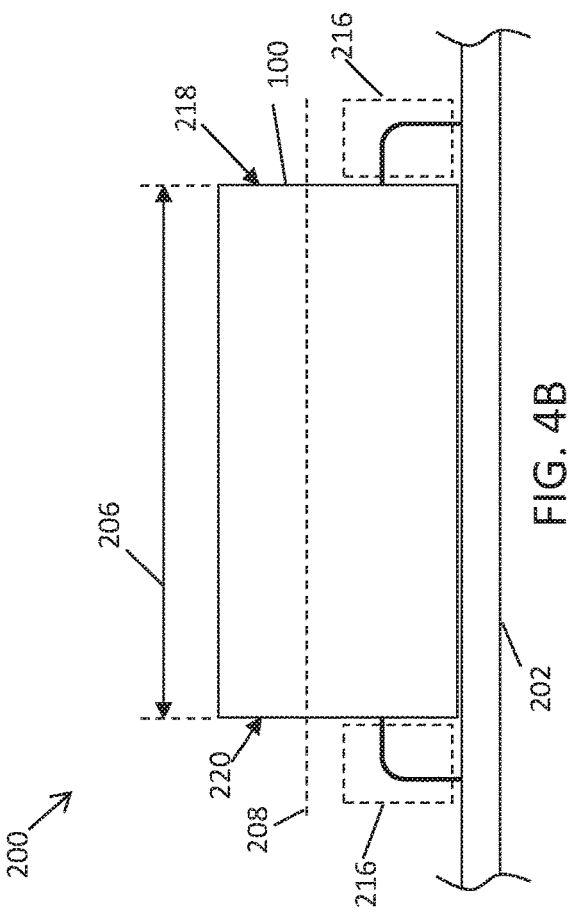

Referring to FIGS. 4A and 4B, in some embodiments, one electrical lead 214 may extend from the first end face 218 of the supercapacitor assembly 100, and the other electrical lead 214 may extend from the second end face 220 of the supercapacitor assembly 100. Such a configuration may provide reduced heat and/or humidity buildup in the areas 216 adjacent the leads 214. For example, electrical current that flows through the electrical leads 214 may generate heat. Thus, by separating the leads 214 on opposite end faces 218, 220, the amount of heat accumulation in these areas 216 may be further reduced, thereby reducing potential damage to the supercapacitor assembly 100 and/or substrate 202.

Figure 5A:
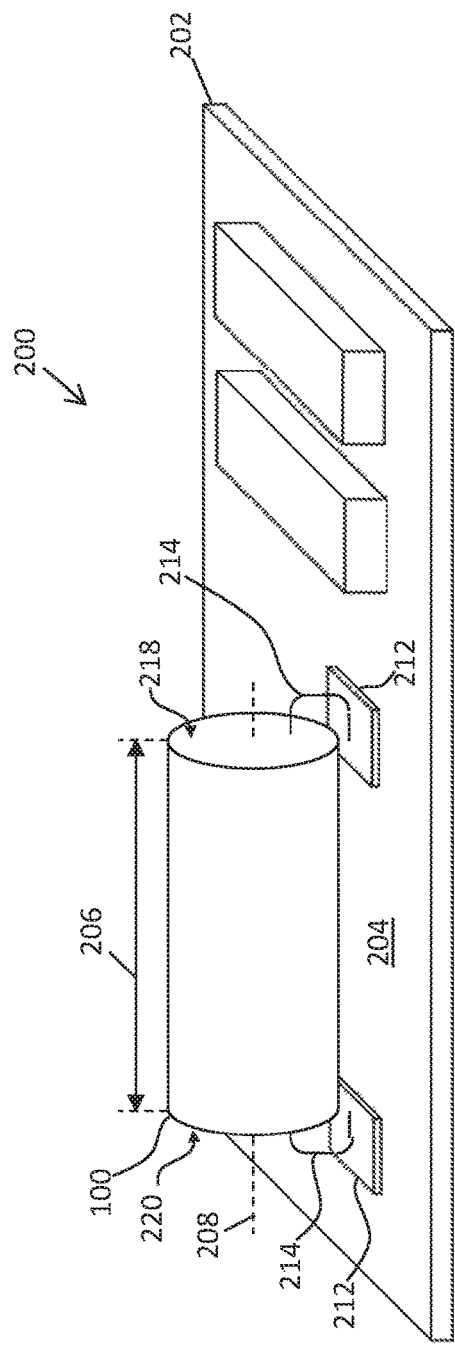
FIGS. 5A and 5B illustrate, respectively, a perspective view and side elevation view of another embodiment of an electrical circuit including a supercapacitor assembly in accordance with aspects of the present disclosure.
Figure 5B:
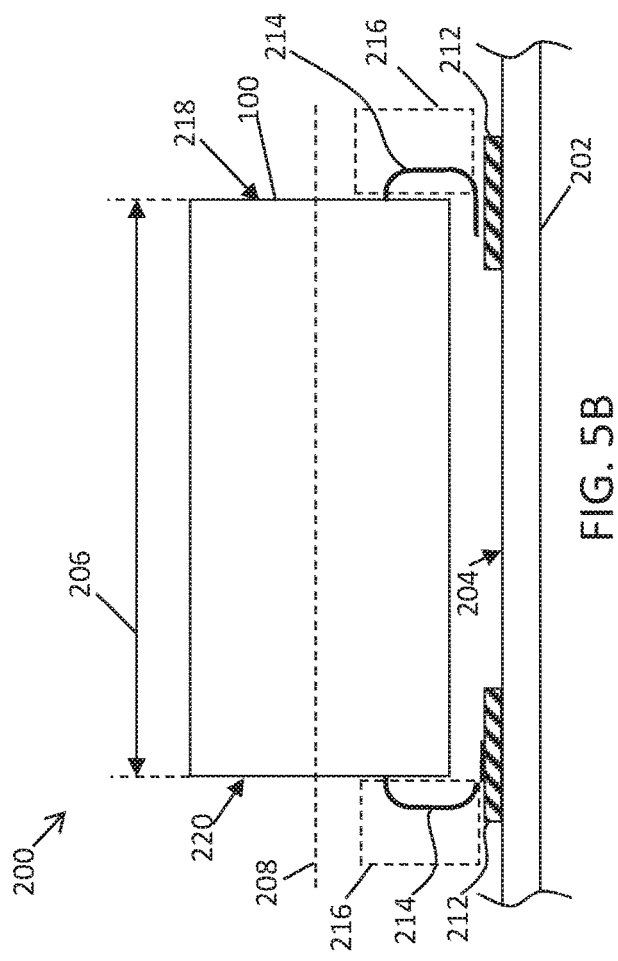

Referring to FIGS. 5A and 5B, in some embodiments, the electrical leads 214 may warp around a body of the supercapacitor assembly 100 and connect with the electrical connections 212. The electrical connections 212 may be configured as solder pads, for example. Such a configuration may provide improved mechanical stability and/or improved electrical connection. Improved electrical connection may reduce the heat generated by current flowing through the leads 214, thereby reducing potential damage to the supercapacitor assembly 100 and/or substrate 202.

In some embodiments, the supercapacitor assembly 100 may be horizontally oriented such that the longitudinal direction 208 of the container 205 of the supercapacitor assembly 100 extends in a horizontal direction with respect to a downward gravity force. Such a configuration may reduce the tendency of the supercapacitor assembly 100 to leak through any seals around the leads 214 and/or seals that seal the supercapacitor assembly 100 closed. For example, such seals may be located between a lid and main body of the housing of the supercapacitor assembly 100. For example, in some embodiments, one or more of the end faces 218, 220 may be configured as lids. One such example lid configuration was discussed above with reference to FIG. 1B.

The leads 214 of the supercapacitor assembly 100 and electrical connections 212 of the substrate 202 may have various configurations. For example, in some embodiments, the electrical leads 214 may be configured as lead wires (e.g., radial leads) attached to the supercapacitor and protruding from one or more of the end faces 118, 220. For example, in some embodiments, the electrical leads 214 may be pre-bent to extend in a perpendicular direction with respect to the longitudinal direction 208 of the supercapacitor assembly 100 to facilitate mounting of the supercapacitor assembly 100 as described herein.

In other embodiments, the electrical leads 214 may be configured as solder pin leads. For example, a solder pin lead may include a tab having a hole therein such that a wire may be hooked through the hole and soldered to the tab. In other embodiments, the pair of electrical leads may be configured as weldable pin leads, for example.

Applications

The various embodiments of the electrical circuit described herein may find application in any suitable type of electrical component. Example applications include power meters, uninterruptible power supplies (UPS), and computer applications, such as power backup for random access memory (RAM). The electrical circuit described herein may find particular application in a meter for measuring a flow of a product, (e.g., electricity, water, gas, etc.).

For example, power meters may be configured to measure power usage (e.g., of residential and/or commercial buildings). Some power meters (e.g., "smart" power meters) may be capable of wirelessly communicating data about the measured power consumption for improved monitoring and/or management of the power grid. For example, smart power meters may communicate power usage to a utility station and/or personal computing device. This may allow residents to monitor the power usage of their house or apartment, which may result in more efficient power use and management.

According to aspects of the present disclosure, power meters may employ a supercapacitor and/or electrical circuit as described herein. The supercapacitor(s) may provide several benefits in the power meter circuit. For example, supercapacitor(s) may supply back-up power in the event of power outages and/or power glitches. This may improve the reliability of the power meter. For example, such power meters may be able to continue transmitting information about power usage despite power glitches or abnormalities that may otherwise prevent the power meter from properly functioning.

Supercapacitors may also extend the life of batteries and/or power supply circuitry in a power meter. For example, supercapacitor(s) may help meet irregular or excessive power demands by the power meter, which may help protect the batteries and/or power supply circuitry.

Power Meters

Figure 6B:
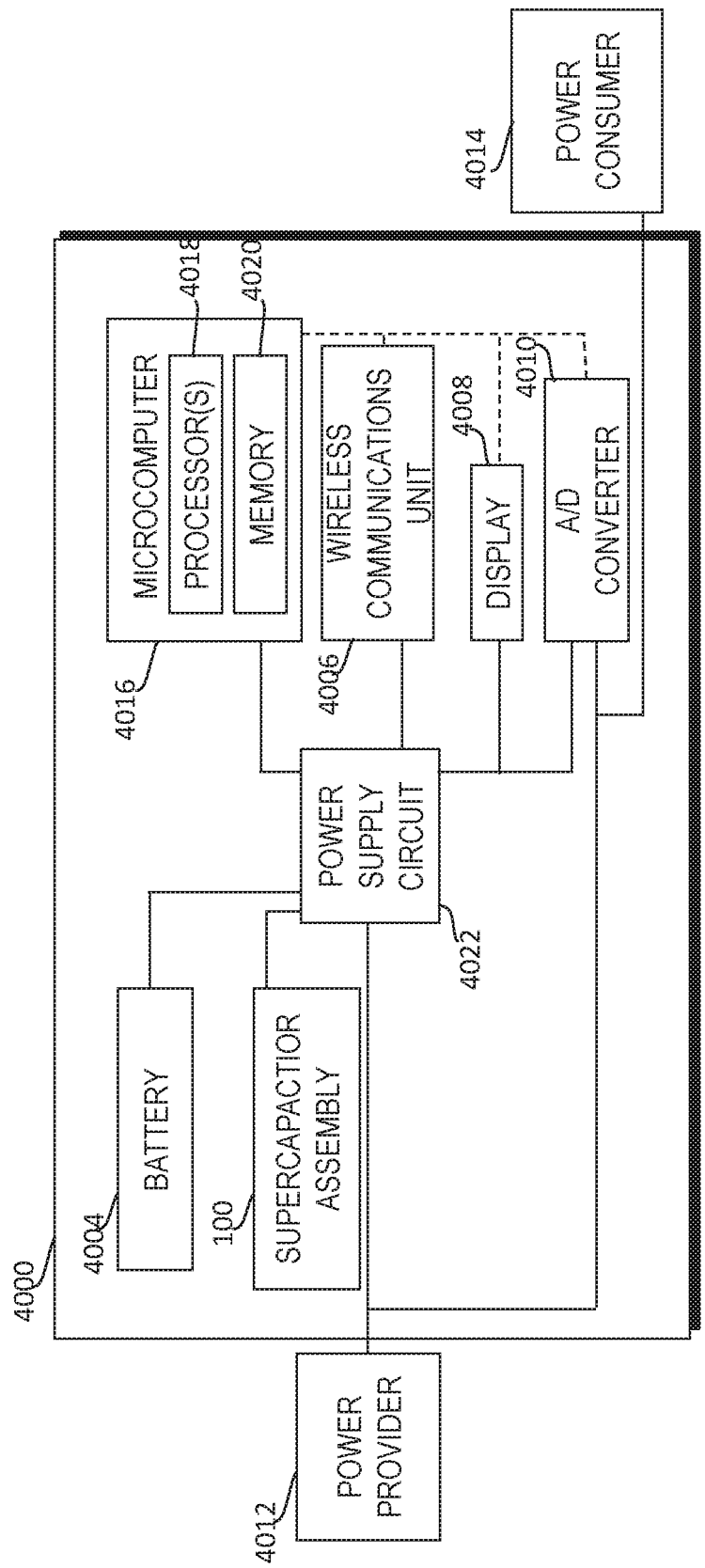
FIG. 6B illustrates a schematic view of an embodiment of a meter for measuring power usage that includes a supercapacitor assembly in accordance with aspects of the present disclosure.

Referring to FIGS. 6A and 6B, in some embodiments, a meter may be configured as a power meter 4000 and include at least one the supercapacitor assembly 100 mounted to a substrate 202, such as a PCB. In some embodiments, the power meter 4000 may also include a battery 4004 that is electrically connected with the supercapacitor assemblies 100. The supercapacitor assemblies 100 may be configured to provide a backup power supply in the event of excessive power demand or battery failure, as discussed above.

The power meter 4000 may be configured as a "smart" power meter and include a wireless communication unit 4006 that is configured to transmit and/or receive data via any suitable network, such as a local wireless network using any suitable wireless communications protocol (e.g., WiFi, Bluetooth, and/or the like) and/or a broader network, such as a wide-area network (WAN), using any suitable communications protocol (e.g., TCP/IP, HTTP, SMTP, FTP). The power meter 4000 may be configured to transmit power usage to a utility provider and/or a user computing device for monitoring.

The power meter 4000 may also include a display 4008 and/or user input device. For example, the display 4008 may be configured as a touchscreen such that a user may input information (e.g., settings, alerts, etc.) using the touchscreen.

The power meter 4000 may include a sensor 4010 configured to measure a power usage rate. For example, in some embodiments, the sensor 4010 may include an A/D converter configured to detect an analog signal (e.g., voltage or current) indicative of a measurement of the power flowing through the power meter 4000. For example, the A/D converter 4010 may be electrically connected with each of a power provider 4012 (e.g., a power grid supplied by a power station) and a power consumer 4014 (e.g., a residential and/or commercial building). The A/D converter 4010 may convert the analog signal into a digital signal indicative of the power usage rate.

The power meter 4000 may also include a microcomputer 4016. In general, the microcomputer 4016 may correspond to any suitable processor-based device(s), such as a computing device or any combination of computing devices. Thus, in several embodiments, the microcomputer 4016 may include one or more processor(s) 4018 and associated memory device(s) 4020 configured to perform a variety of computer-implemented functions. As used herein, the term "processor" refers not only to integrated circuits referred to in the art as being included in a computer, but also refers to a programmable logic controller (PLC), an application specific integrated circuit, and other programmable circuits. Additionally, the memory device(s) may generally comprise memory element(s) including, but not limited to, computer readable medium (e.g., random access memory (RAM)), computer readable non-volatile medium (e.g., a flash memory), a compact disc-read only memory (CD-ROM), a magneto-optical disk (MOD), a digital versatile disc (DVD) and/or other suitable memory elements. Such memory device(s) may generally be configured to store suitable computer-readable instructions that, when implemented by the processor(s) configure the controller to perform various computer-implemented functions.

The microcomputer 4016 may be communicatively coupled with the wireless communications unit 4006, display 4008, and/or A/D converter 4010. The microcomputer 4016 may be configured to receive signals from the sensor 4010 indicative of the power usage rate and calculate the power usage rate based on the received signals. The microcomputer 4016 may also be configured to transmit the power usage rate via the wireless communications unit 4006 and/or control the operation of the display 4008 such that the power usage rate may appear on the display 4008.

The smart meter 4000 may also include a power supply circuit 4022. The power supply circuit 4022 may be electrically connected with the supercapacitor assemblies 100, the battery 4004, and/or the power provider 4012. For example, the power supply circuit 4005 may be configured to regulate power supplied from at least one supercapacitor assembly 100, the battery 4004, and/or the power provider 4012 to the microcomputer 4012, wireless communication unit 4006, display 4008, and/or A/D converter 4010. For example, if the power supplied by the power provider 4012 becomes intermitted and/or irregular, the power supply circuit 4022 may draw power from the battery and/or supercapacitor assembly 100 to meet the demands of the other components included in the smart meter 4000.

The smart power meter 4000 may be configured to as an "Internet of Things" ("IoT") device. The microcomputer 4016 may be configured to perform other various functions. For example, the microcomputer 4016 may be configured to detect when the power usage rate exceeds a predetermined threshold and transmit an alert (via the wireless communications unit 4006). In some embodiments, the microcomputer 4016 may also be configured to wireless communicate (via the wireless communications unit 4006) with individual power-consuming devices, such as smart appliances, for example. The microcomputer 4016 may be configured to monitor the power used by such appliances with respect to the total power usage rate detected by the A/D converter 4010. For example, the microcomputer 4016 may be configured to compile a summary showing the total power used in a given time period (e.g., one month) and the portions thereof used by individual power-consuming devices (e.g., smart appliances). The microcomputer 4016 may be configured to transmit the summary via the wireless communications unit 4006 to the resident of the house, for example.

Water and Gas Meters

In other embodiments, the meter may be configured as a water or gas meter. In such embodiments, the sensor 4010 may be a flow transducer and be configured to generate signals indicative of the flow rate of water or gas from a source to a consumer unit (e.g., a residential or commercial building). In such embodiments, battery 4004 and/or supercapacitor assembly 100 may be the sole supply of power for the meter. Thus, the power supply circuit 4022 may be configured to regulate the power supplied from the battery 4004 and supercapacitor assembly 100 to the other components of the meter. In the event of battery failure, the supercapacitor assembly 100 may provide power for an additional time period such that the meter may send a signal via the wireless communications unit 4006 indicating that the battery 4004 has failed and that servicing is needed.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:
1. An electrical circuit comprising:
a substrate comprising a generally planar surface and including a pair of electrical connections on the generally planar surface; and
a supercapacitor assembly comprising a container having a length in a longitudinal direction, the supercapacitor assembly comprising a pair of electrical leads and an electrode assembly enclosed within the container, the electrode assembly having a jelly-roll configuration and the pair of electrical leads being electrically connected with respective ones of the pair of electrical connections;

wherein an angle is formed between the longitudinal direction of the container and the generally planar surface of the substrate including the pair of electrical connections, the angle ranging from greater than 0 degrees to about 30 degrees, wherein a vertex of the angle is at an end of the container adjacent the electrical leads.

2. The electrical circuit of claim 1, wherein the supercapacitor assembly is mounted to the substrate such that the longitudinal direction of the supercapacitor assembly generally extends in a horizontal direction.

3. The electrical circuit of claim 1, wherein the container comprises a first end face and a second end face that is spaced apart from the first end face in the longitudinal direction, and each of the pair of electrical leads extend from the first end face.

4. The electrical circuit of claim 1, wherein:
the container comprises a first end face and a second end face that is spaced apart from the first end face in the longitudinal direction; and
the container is sealed on at least one of the first end face or second end face.

5. The electrical circuit of claim 1, wherein the supercapacitor assembly has a capacitance ranging from about 1 F to about 1,500 F.

6. The electrical circuit of claim 1, wherein the supercapacitor assembly has an operating voltage ranging from about 2 V to about 4 V.

7. The electrical circuit of claim 1, wherein the length of the container ranges from about 10 mm to about 250 mm.

8. The electrical circuit of claim 1, wherein the container has a generally cylindrical shape.

9. The electrical circuit of claim 8, wherein the container has a diameter ranging from about 5 mm to about 70 mm.

10. The electrical circuit of claim 1, wherein the pair of electrical leads are configured as radial leads.

11. The electrical circuit of claim 1, wherein the pair of electrical leads are configured as solder pin leads.

12. The electrical circuit of claim 1, wherein the pair of electrical leads are configured as weldable pin leads.

13. A meter for measuring a flow of a product, the meter comprising:
a substrate comprising a generally planar surface and including a pair of electrical connections on the generally planar surface; and
a supercapacitor assembly comprising a container having a length in a longitudinal direction, the supercapacitor assembly comprising a pair of electrical leads and an electrode assembly enclosed within the container and having a jelly-roll configuration and the pair of electrical leads being electrically connected with respective ones of the pair of electrical connections;
wherein an angle is formed between the longitudinal direction of the container and the generally planar surface of the substrate including the pair of electrical connections, the angle ranging from greater than 0 degrees to about 30 degrees, wherein a vertex of the angle is at an end of the container adjacent the electrical leads.

14. The meter of claim 13, wherein the meter is configured to measure a flow of at least one of electricity, gas, or water.

15. The meter of claim 13, wherein the substrate is mounted such that the generally planar surface extends in a horizontal direction.

16. The meter of claim 13, wherein the angle is from greater than 0 degrees to 20 degrees.

17. An electrical circuit comprising:
a substrate including a pair of electrical connections on a generally planar surface; and
a supercapacitor assembly mounted to the substrate, the supercapacitor assembly comprising a container having a length in a longitudinal direction, the supercapacitor assembly comprising a pair of electrical leads and an electrode assembly enclosed within the container, the electrode assembly having a jelly-roll configuration and the pair of electrical leads being electrically connected with respective ones of the pair of electrical connections;
wherein the longitudinal direction of the supercapacitor generally extends in a horizontal direction wherein an angle formed between the longitudinal direction of the container and the generally planar surface of the substrate including the pair of electrical connections is from greater than 0 degrees to about 75 degrees, wherein a vertex of the angle is at an end of the container adjacent the electrical leads.

* * * * *